US007859261B2

(12) United States Patent
Jattke et al.

(10) Patent No.: US 7,859,261 B2
(45) Date of Patent: Dec. 28, 2010

(54) MAGNETIC RESONANCE METHOD AND APPARATUS FOR AUTOMATICALLY DETERMINING OBJECTS THAT ATTENUATE PENETRATING RADIATION

(75) Inventors: Kirstin Jattke, Erlangen (DE); Berthold Kiefer, Erlangen (DE); Sonia Nielles-Vallespin, Nürnberg (DE); Stefan Roell, West Chester, PA (US); Marianne Vorbuchner, Erlangen-Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 230 days.

(21) Appl. No.: 12/052,856

(22) Filed: Mar. 21, 2008

(65) Prior Publication Data

US 2008/0231275 A1 Sep. 25, 2008

(30) Foreign Application Priority Data

Mar. 21, 2007 (DE) .................. 10 2007 013 564

(51) Int. Cl.
*G01V 3/00* (2006.01)
*A61B 5/055* (2006.01)

(52) U.S. Cl. .................. 324/307; 324/309; 324/318; 600/410; 600/411; 600/427

(58) Field of Classification Search ......... 324/300–322; 600/407–435; 424/9.32; 455/293; 330/4; 365/151

See application file for complete search history.

(56) References Cited

U.S. PATENT DOCUMENTS

| 2,909,654 | A | * | 10/1959 | Bloembergen | 455/293 |
| 3,015,072 | A | * | 12/1961 | Schultz-DuBoise et al. | 330/4 |
| 3,119,099 | A | * | 1/1964 | Biernat | 365/151 |
| 3,191,119 | A | * | 6/1965 | Singer | 324/306 |
| 3,932,805 | A | * | 1/1976 | Abe et al. | 324/309 |
| 4,770,183 | A | * | 9/1988 | Groman et al. | 424/9.32 |
| 4,799,016 | A | * | 1/1989 | Rezvani | 324/318 |
| 6,618,608 | B1 | * | 9/2003 | Watkins et al. | 600/412 |
| 6,873,153 | B2 | * | 3/2005 | Frydman | 324/307 |
| 7,069,068 | B1 | * | 6/2006 | Ostergaard | 324/309 |
| 7,271,588 | B2 | * | 9/2007 | Frydman | 324/318 |
| 7,288,936 | B2 | * | 10/2007 | Larson et al. | 324/307 |
| 7,327,138 | B2 | | 2/2008 | Krieg et al. | 324/307 |
| 7,474,097 | B2 | * | 1/2009 | Bydder et al. | 324/307 |

(Continued)

FOREIGN PATENT DOCUMENTS

WO    WO 2005026748 A2 * 3/2005

OTHER PUBLICATIONS

"Magnetic Resonance Imaging-Guided Attenuation and Scatter Corrections in Three-Dimensional Brain Positron Emission Tomography," Zaidi et al, Med. Phys., vol. 30, No. 5 (May 2003), pp. 937-948.

"Comparative Assessment of Statistical Brain MR Image Segmentation Algorithms and Their Impact on Partial Volume Correction in PET," Zaidi et al, NeuroImage, vol. 32 (2006), p. 5091-1607.

(Continued)

*Primary Examiner*—Melissa J Koval
*Assistant Examiner*—Tiffany A Fetzner
(74) *Attorney, Agent, or Firm*—Schiff Hardin LLP (57) ABSTRACT

In a method and an apparatus for automatic determination of objects that attenuate high energy/penetrating radiation by magnetic resonance, the magnetic resonance apparatus scans and prepares MR images, and the MR images contain information about the T2 relaxation time constant. Subsequently, penetrating radiation-attenuating objects are determined in the MR images by means of the T2 relaxation time constant.

30 Claims, 3 Drawing Sheets

U.S. PATENT DOCUMENTS

| | | | |
|---|---|---|---|
| 2005/0007111 A1* | 1/2005 | Frydman | 324/307 |
| 2005/0033151 A1* | 2/2005 | Wu et al. | 600/410 |
| 2005/0134275 A1* | 6/2005 | Frydman | 324/321 |
| 2006/0147492 A1* | 7/2006 | Hunter et al. | 424/426 |
| 2006/0214659 A1* | 9/2006 | Larson et al. | 324/307 |
| 2007/0080685 A1* | 4/2007 | Bydder et al. | 324/309 |
| 2007/0255129 A1* | 11/2007 | Du et al. | 600/410 |
| 2008/0231275 A1* | 9/2008 | Jattke et al. | 324/309 |

OTHER PUBLICATIONS

"Clinical Ultrashort Echo Time Imaging of Bone and Other Connective Tissues," Robson et al, NMR In Biomedicine, vol. 19 (2006), pp. 765-780.

"Magnetic Resonance: An Introduction to Ultrashort TE (UTE) Imaging," Robson et al, Comput. Assist. Tomogr., vol. 27, No. 6 (2003) pp. 825-846.

* cited by examiner

MAGNETIC RESONANCE METHOD AND APPARATUS FOR AUTOMATICALLY DETERMINING OBJECTS THAT ATTENUATE PENETRATING RADIATION

BACKGROUND OF THE INVENTION

1. Field of the Invention

The present invention concerns a method and a device for an automatic determination of objects that attenuate high-energy (penetrating) radiation, by magnetic resonance. The invention also concerns a corresponding magnetic resonance apparatus and a computer-readable medium encoded with programming instructions for computerized implementation of such a method.

2. Description of the Prior Art

The article "Magnetic Resonance: An Introduction to Ultra-short TE (UTR) Imaging", M. D. Robson et al., Comput Assist Tomogr., Vol. 27, No. 6, November/December 2003 describes the basic principles of magnetic resonance imaging.

In order to irradiate tumors, such as cancer tumors, with high-energy radiation, in particular gamma radiation, image data are required for the following reasons:
1. Based on the image data, a target volume (region of interest) is determined, which is to be irradiated.
2. Based on the image data, tissue can be localized that is sensitive to radiation, for example, nerves.
3. Based on the image data, any attenuation of the high-energy radiation in its propagation to the target volume is determined.

According to the state of the art, MR image data, i.e., image data that has been prepared by a magnetic resonance tomography, is used for Points 1 and 2, but it is conventional to use 3D CT image data for Point 3. Since image data prepared by absorption of X-Rays are obtained using a computed tomography apparatus, intensity values of the CT scanners show the density of the objects represented in the CT images in good resolution ("Hounsfield units"), which is why computed tomography is well suited for the task described under Point 3. It should be pointed out that that it is also possible to use CT images for all three above-mentioned points, which is still quite common.

The preparation of CT images by computed tomography based on irradiation with X-rays represents a radiation stress for the person from whom the CT images are acquired. In addition, the development of increasingly accurate irradiation methods, which allow focus delimitation in the millimeter range and thus exhibit a modulation of an intensity distribution in the focus, and the absence of good soft-tissue contrast in the CT images, is increasingly perceived as a disadvantage. When both MT images and CT images are prepared, two relatively costly installations must be used (a computed tomography system and a magnetic resonance tomography system) in order to perform the task described in Points 1 to 3 above.

SUMMARY OF THE INVENTION

An object of the present invention is to provide a method and a device with which it is no longer necessary to use computed tomography in order to determine the attenuation of high-energy radiation in its propagation path to a target volume.

This object is achieved in accordance with the invention by a method for automatic determination penetrating of radiation attenuating objects by magnetic resonance including the steps of preparation of MR images with a magnetic resonance installation, with the MR images containing information about the T2 relaxation time constant, and scanning and localization of radiation attenuating objects in the MR images using the information about the T2 relaxation time constant.

The term penetrating "radiation-attenuating object" as used herein encompasses every object that attenuates penetrating radiation (in particular high-energy radiation, which, for example, is used in treating tumors by radiation). In particular, a radiation-attenuating object means an object that attenuates penetrating radiation more strongly than soft tissue.

The T2 relaxation constant describes the time or speed, with which a synchronized precessing of protons, that have been excited to cause the precessing, disappears due to spin-spin interaction, and the faster the precessing of the protons subsides, the smaller is the T2 relaxation constant.

By being able to determine radiation-attenuating objects by means of the T2 relaxation time constant in MR images, calculate the attenuation of high-energy radiation can be calculated along or in a specific path to a target volume by determining those radiation-attenuating objects that lie in that path. Thus, it is advantageously possible to determine attenuation of high-energy radiation without having to expose the patient to X-rays, and it is also possible to carry out all essential steps for the preparation of irradiation of a target volume using only a magnetic resonance installation (without any computed tomography system). Naturally, with the method according to the invention it is also possible to determine a radiation path in which only a minimum number of radiation-attenuating objects lie.

The radiation-attenuating objects can be determined in the MR images by the MR images, objects being identified or scanned that exhibit a T2 relaxation time constant that is smaller than a pre-determined threshold value. This pre-determined threshold value preferably lies in the time range between 1 and 5 ms, and preferably in a time range between 2 and 3 ms.

Since in the MR images those objects are determined that exhibit a relaxation time constant that is extremely small, this allows high-density structures, such as bones, to be imaged. Since high density bodies attenuate high-energy radiation more strongly than other tissues, this allows such objects to be determined, compared to other objects in the human body, for example, normal tissue.

Encompassed within the scope of an object exhibiting a T2 relaxation time constant that is extremely small, is an object composed of several components and a majority of these components exhibit an extremely small T2 relaxation time constant. Of course, in such an object there usually exist also a few components that have a longer T2 relaxation time constant. There also exist objects that have a longer T2 relaxation time constant but contain components with an extremely small T2 relaxation time constant.

In the latter objects, however, in relation to the share of components with a longer T2 relaxation time constant, the share of components with an extremely small T2 relaxation time constant is small so that, in a simplified way, such an object is considered to exhibit a longer T2 relaxation time constant.

In an embodiment of the method according to the invention, in MR images signals of objects that have a T2 relaxation time constant greater than a pre-determined threshold value are suppressed. This is possible, for example, by determining other objects in the MR images that have a middle or long T2 relaxation time constant (i.e., they have a T2 relaxation time constant that is greater than the pre-determined threshold value), and then the images of these other objects are subtracted from the MR images. In other words, MR images measured with a longer TE (time echo) are subtracted from the images with a very short TE.

By kind of removing from MR images any objects with a middle and a long T2 relaxation time constant, objects with a short T2 relaxation time constant, i.e., high density structures, can be better represented, determined and localized in the MR images because the interfering influences of the objects with middle and long T2 relaxation time constants are no longer in the way.

In an embodiment according to the invention, the MR images are prepared such that a short RF pulse is generated. During a very short first pre-determined time interval, after an end of this RF pulse, data are entered into k space that correspond to a segment to be examined. The short, pre-determined time interval is preferably within the range of μs to 1 ms. Since the data acquisition begins as soon as possible after the end of the RF pulse, the system is able to still capture signals of objects, which have a minute T2 relaxation time constant (in the magnitude of 1 ms to 5 ms). The interval between the end of the RF pulse and the beginning of the data capturing depends in particular on the "ring-down" time of a local coil, with which the data is captured. The ring-down time indicates how fast the magnetic field induced by the RF pulse in the local coil fades.

According to this invention, any imaging method for displaying objects with a very short T2 relaxation time constant can be used to determine radiation-attenuating objects. According to the state of the art, these imaging methods are known in general under the term UTE-MRI (Ultra-short Time Echo Magnetic Resonance Imaging).

According to another embodiment of this invention, data are acquired during a long, second pre-determined time interval after the short RF pulse. Subsequently, the additional acquired data are subtracted from that data that were acquired during the short pre-determined time interval after the RF pulse, as explained in connection with the previous embodiment. Based on such data, which are the result of the corresponding subtraction, MR images are then prepared.

It is possible to acquired the data and the additional data by means of a common short RP pulse by the data being acquired during the short, first pre-determined time interval after the RF pulse, and the additional data being acquired during the long, second time interval after the RF pulse. However, it is also possible to acquired the data and the additional data by two different measurements with each measurement having its own short RF pulse. It is important, of course, that the data and the additional data relate to the same object.

By subtracting the additional data from the data, the resulting data advantageously contain almost only signals of objects with the correspondingly short T2 relaxation time constant so that these objects, which attenuate high-energy radiation more strongly than objects with a longer T2 relaxation time constant, can be clearly displayed and localized.

This also allows the advantage of being able to distinguish lipids from bone-type structures. Lipids manifest a broad scatter band in the T2 relaxation time constant and they envelope bones or are integrated in bones. However, since lipids are also visible in conventional MR images resulting from imaging processes that operate with a longer TE, as is quite common according to the state of the art, a comparison of a conventional MR image and a UTE image (an MR image obtained with an ultra short TE) of the same region allows also a differentiation between bones and fat or lipids.

The data and/or the additional data can be entered in k space using a radial scanning technique. Radial scanning has advantages especially if the acquisition of data occurs as soon as possible after the RF pulse.

The method according to the invention for an automatic determination of radiation-attenuating objects is preferably carried out before a target volume (region of interest), for example, a tumor, in the body of a living thing is irradiated with high-energy radiation, in order to initially determine a radiation path in which the high-energy radiation is attenuated by radiation-attenuating objects as little as possible, and subsequently to be able to determine the degree of attenuation of the high-energy radiation on the radiation path from the source of radiation to the target volume (region of interest), so the high-energy radiation propagation path can be oriented accordingly.

It can be of advantage to determine the degree of attenuation of the high-energy radiation by these objects using the information about the T2 relaxation time constant of the objects in the MR images. Thus, it is possible, for a pre-determined radiation path, to determine the degree to which the high-energy radiation on this radiation path will be attenuated, by determining the objects that lie in this radiation path together with their individual (i.e., specific for each particular object) degree of radiation attenuation.

Furthermore, according to this invention it is possible to acquire signals of the cladding of a local coil by determining objects with an extremely small relaxation time constant. Using the signals of the cladding, the corresponding local coil can be localized.

Any quantity of copper in the local coils results in some attenuation of the high-energy radiation and, furthermore, in an undesired secondary radiation. According to the invention, by localizing a local coil it is possible either to select the radiation path in such a way that no local coils are present in the radiation path, or to take into account the attenuation due to local coils when choosing the dosage of the high-energy radiation.

It is possible for local coils to be localized through aliasing, this aliasing being caused by the local coil and occurring in a volume or layer in which MR images have been acquired. Due to the aliasing, subsequently, by means of known information about the form or design of the local coil, the exact form and especially the exact position of this local coil can be determined.

Thus, according to the invention, it is possible to determine the exact position and also the exact form of a local coil so that during the irradiation of a patient, on whom such a local coil or coils is/are arranged, the design and the locations of these coils can be taken into consideration. Since the information about the local coils is gathered through aliasing, it is advantageously not necessary for the local coil to be in the volume (region of interest) nor for raw data originating from the local coil k space in which the data for MR imaging are entered, but a sufficient geometric imaging accuracy is required over a sufficiently large field of view.

Aliasing is understood as a process by which an object—in this case a local coil—contributes to the generation of a signal in a volume (region of interest) even though the object itself is not present in the volume. Under normal circumstances, aliasing is considered an interference, because it per se cannot be presented and it obscures the actual signal, thus distorting it. However, if its is known which objects (together with the exact position and form of these objects)—in this case local coils—cause the aliasing, the signal components resulting from the aliasing can be determined and these signal components can be suppressed during the acquisition of the data accordingly so that that data, from which subsequently the MR images (which do not display the objects that cause the aliasing) are prepared, do not contain the data components originating from the aliasing.

The method can be calibrated by the results of the method being adjusted to the results obtained by computed tomography. Since according to the state of the art, computed tomography is considered to be a common method, which can determine both the radiation-attenuating objects and the degree of attenuation of high-energy radiation by the same objects, it is possible to adjust the method according to the invention in such a manner that, after this adjustment or calibration, it can provide the same results as a method based on computed tomography.

The method according to the invention can be quantitatively verified in vivo, because a method based on computed tomography can be used as the so-called gold standard. Consequently, it is possible for the same patient and for an identical radiation plan to first determine an attenuation correction for the dosage of the high-energy radiation based on the results of computed tomography and, secondly, to prepare another attenuation correction by means of the method according to this invention, which operates exclusively by magnetic resonance.

The invention also encompasses a device for a magnetic resonance apparatus for an automatic determination of radiation-attenuating objects. This device includes a control unit that controls the magnetic resonance apparatus, a reception device to receive signals that are produced by the magnetic resonance apparatus (in particular by the local coils), and an evaluation unit to evaluate these signals and prepare an MR image from them. The device is designed in such a manner that the magnetic resonance apparatus is controlled through the control unit such that the magnetic resonance apparatus receives MR images or acquires the corresponding data.

During the acquiring of data, the magnetic resonance apparatus also acquires information about the T2 relaxation time constant of the objects that are displayed in the MR images. Thus, the apparatus is able by means of the evaluation unit, to determine the radiation-attenuating objects using the information about the T2 relaxation time constant.

The advantages of the device according to the invention basically correspond to the advantages of the method according to the invention, so they not be repeated.

The present invention also encompasses, a magnetic resonance apparatus provided with the aforementioned device.

This magnetic resonance apparatus can include a device with which high-energy radiation is generated and this radiation can be oriented to a target volume (region of interest).

Therefore, according to this invention, it is possible for the same magnetic resonance apparatus to prepare all data required for the irradiation of tumors and to also carry out the irradiation itself. This has the advantage that the whole treatment time required for the planning of the irradiation and the irradiation itself is shortened.

Moreover, the present invention encompasses a computer-readable medium encoded with programming instructions, a software product, which can be downloaded into the memory of a programmable control unit of a magnetic resonance apparatus. Using the programming instructions stored in this medium, all previously described embodiments of the method according to this invention can be implemented.

The medium can be an electronically readable data carrier, for example, a DVD, that stores electronically readable control information, in particular software.

After this control information is read from the data carrier and stored in the control unit of a magnetic resonance apparatus, all previously described embodiments of the method according to this invention can be implemented.

The present invention is suited especially for the planning of irradiation of tumors with high-energy radiation, to especially optimize a radiation path of this high-energy radiation, and also to optimally design or dose the high-energy radiation itself. Of course, the present invention is not restricted to this preferred range of application; it can be used to localize any solid-body structures, such as the plastic cladding of a local coil.

Using the present invention, a CT examination can usually be eliminated that, according to the current state of the art, is used for the planning of irradiation with high-energy radiation. Thus the patient is spared one session of X-ray radiation and according to this invention it is possible to perform the planning of the irradiation exclusively with an MR installation, while according to the state of the art, both MR images and CT images are prepared. This represents an economic advantage because the time required for the preparation of data for the planning of the irradiation can be shortened because the patient needs only to be examined with the magnetic resonance apparatus, and depending on the circumstances, no computed tomography system needs to be employed.

DESCRIPTION OF THE PREFERRED EMBODIMENTS

Figure 1:
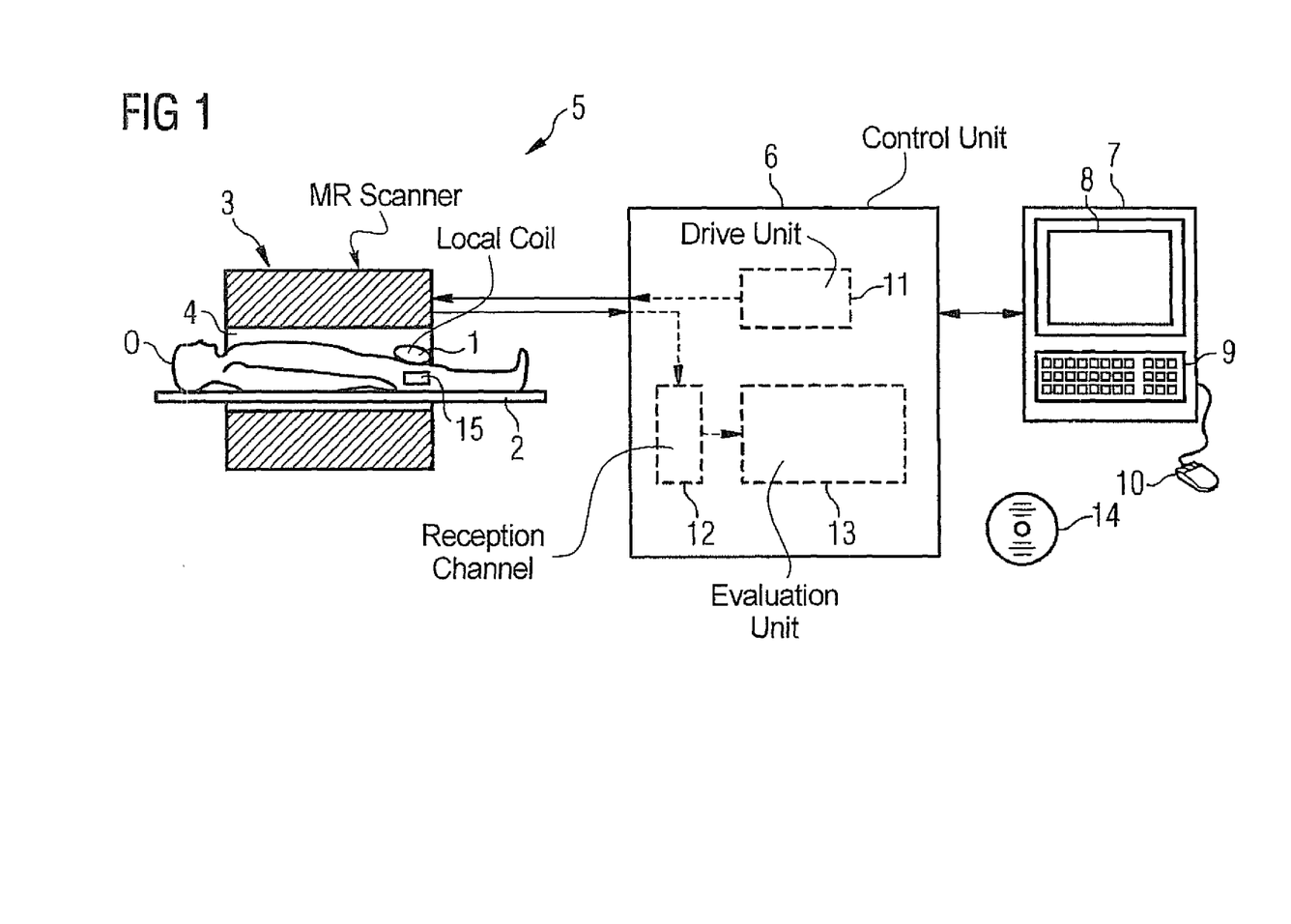
FIG. 1 illustrates a magnetic resonance apparatus according to this invention with a device designed according to this invention.

FIG. 1 shows an embodiment for a magnetic resonance apparatus 5, which allows an automatic determination of penetrating radiation-attenuating objects. The core component of this magnetic resonance apparatus 5 is a scanner 3, in which is positioned a patient 0 on a bed or couch 2 in a cylindrical basic field magnet (not shown), which envelops an examination volume 4.

The bed 2 can slide in the longitudinal direction, i.e., along the longitudinal axis of the scanner 3. This direction is called the z-direction. Within the basic field magnet in the scanner 3, there is a whole-body coil (not shown), which emits and receives radio-frequency pulses. In addition, the scanner 3 includes gradient coils (not shown) in order to generate a magnetic field gradient in all the spatial directions x, y, z.

The scanner 3 is controlled by a control unit 6, which is illustrated here separately from the scanner 3. Connected to the control unit 6 is a terminal 7, which has a display 8, a keyboard 9, and a mouse 10. The terminal 7 serves especially as a user interface, through which an operator operates the control unit 6 and thus the scanner 3. Both the control unit 6 and the terminal 7 are components of the magnetic resonance apparatus 5.

Furthermore, FIG. 1 shows a DVD 14, in which software is stored, with which the method according to this invention can be implemented after the software has been downloaded into the control unit 6.

Moreover, the magnetic resonance apparatus 5 can also have all other common components or features, such as interfaces for the connection of a communication network for example, an image information system, or similar technology. For clarity, FIG. 1 does not show any of these components.

An operator can communicate with the control unit 6 through the terminal 7 to execute the desired measurements by the scanner 3 being controlled by the control unit 6 so that the required radio-frequency pulse sequences are emitted from the antenna, and the gradient cols are suitably switched. The control unit 6 also receives image raw data coming from the scanner 3, which are then converted into images (MR images) in an evaluation unit 13, which is a module of the control unit 6. These images are then, for example, represented on the display 8 and/or stored in a memory and/or sent out through a network.

The bed 2 can be moved within the scanner 3 in the z-direction by a motor controlled by the control unit 6. The control unit 6 has a drive unit 11, which automatically drives the bed 2 through the scanner 3 and/or moves the bed 2 to specific positions within the scanner 3. Moreover, the control unit 6 ensures that a defined magnetic field gradient $G_z$ is present in the z-direction and, at the same time, a radio-frequency signal essentially corresponding to magnetic resonance frequency is emitted from the whole-body coil.

By means of a reception channel 12 and a measuring device of the control unit 6, data from the corresponding target volume 15 (volume of interest) in the body of patient 0 are detected (received) by a local coil 1. This acquired data includes signals from objects with a very short T2 relaxation time constant, in the magnitude of 3 ms. In the evaluation unit 13, the data are converted into MR images, in which—also in the evaluation unit 13—radiation-attenuating objects are determined and localized by means of the T2 relaxation time constant.

Figure 2:
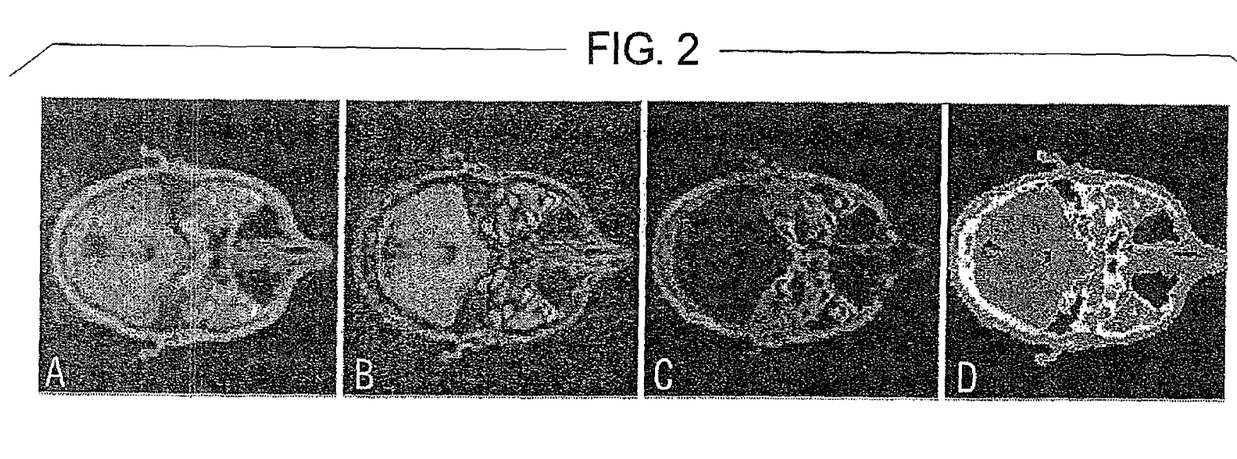
FIG. 2 shows MR images that have been prepared using the method according to the invention.

Image A in FIG. 2 represents an MR image that has been prepared using the imaging method according to this invention, and in which objects are represented that exhibit a very short T2 relaxation time constant. These imaging methods, with which even objects with a very short T2 relaxation time constant can be displayed, are known under the general term UTE-MRI. Due to the use of very short echo times (TE), proton spin systems with a very short T2 relaxation time constant, as occur in high density body structures such as bones, are displayed directly in the particular MRI image as shown in image A. Since naturally objects that have a middle or long T2 relaxation time constant also generate signals that are acquired by UTE MRI, not only signals of spins with a very short T2 relaxation time constant are used to prepare the MR image as shown in image A, but also signals of spins with a longer T2 relaxation time constant. This is why image A shows bones as well as tissue.

Image B in FIG. 2 is an MR image that has been prepared by conventional imaging methods, with which objects with a very short T2 relaxation time constant cannot be displayed. In other words, to prepare the image B, only signals of spins have been used that have a middle or long T2 relaxation time constant so that the MR image represented as image B shows only tissue.

Image C in FIG. 2 is an MR image obtained when the image A is subtracted image B. Therefore, image C no longer shows any tissue but only bone-type structures. Since tissue lets through high-energy radiation almost without any obstructions, whereas bone-type structures attenuate the high-energy radiation, the image represents exclusively radiation-attenuating objects.

Image D in FIG. 2 is an image in which an observer can distinguish between objects that differ from each other in their T2 relaxation time constant so that the observer can especially distinguish bonelike structures and tissue.

Figure 3:
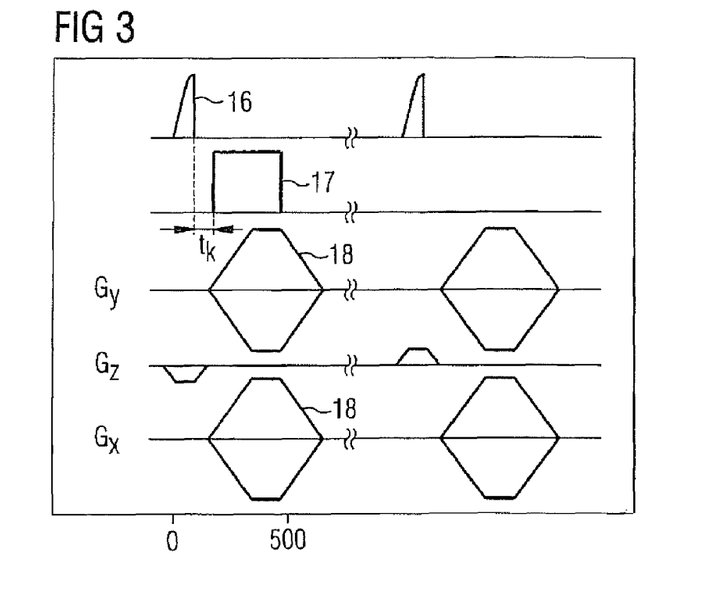
FIG. 3 is a sequence diagram for the acquisition of signals from objects with a very short T2 relaxation time constant.

FIG. 3 schematically illustrates the basic design of a sequence diagram of an exemplary UTE-MRI procedure. The x-axis represents time in µs and the y-axis represents the strength of a magnetic field (not true to scale).

In a short time interval $t_k$ in the magnitude of 100 µs (in future coils also already after 30 µs or even 1 µs due to a shortened coil detune interval of these coils) after a short truncated or half 90° HF pulse 16, data capturing 17 begins, during which both a gradient $G_x$ in the x-direction and a gradient $G_y$ in the y-direction are prepared for data capturing in order to implement radial scanning.

During the data capturing, the strength of the magnetic field of these gradients 18 increases up to a maximum value, which the gradients 18 then have until the end of the data capturing. For more detailed information, see "Magnetic Resonance: An Introduction to Ultra-short TE(UTE) Imaging", M. D. Robson et al., Comput Assist Tomogr., Vol. 27, No. 6, November/December 2003.

Figure 4:
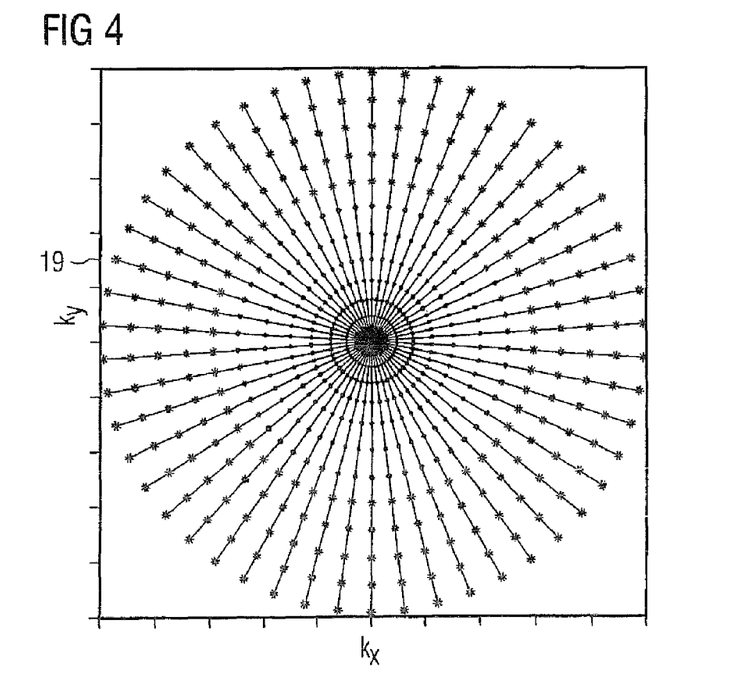
FIG. 4 illustrates trajectories in k space for radial data entry.

FIG. 4 represents trajectories in k space 19 for the aforementioned scanning technology. Each "spoke" represents the corresponding trajectory of the k space, which is set up by means of the gradient 18 (See FIG. 3). The points represent the central points that are scanned when the gradients 18 increase, and the stars represent the circumferential points that are scanned when the gradients are at their maximum value. In practice, the data capturing usually includes 128-512 spokes and 156-512 points on each spoke. The data points can be converted by a 2D Fourier transformation into a Cartesian coordinate system.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for therapeutically treating tissue in a living subject with high-energy radiation comprising the steps of:
    designating a target volume in a living subject containing tissue to be irradiated with high-energy radiation, said high-energy radiation having an energy associated therewith that produces a therapeutically beneficial modification of said tissue;
    prior to irradiating said target volume with said high-energy radiation, obtaining a magnetic resonance image, with a magnetic resonance apparatus, of a region of the subject containing said target volume by exposing the subject in the magnetic resonance apparatus to a magnetic resonance imaging sequence that causes the magnetic resonance image to contain information that is representative of the T2 relaxation time constant of all objects contained in said region;
    in a processor, automatically identifying a degree of attenuation of the high-energy radiation in the said region represented in said obtained magnetic resonance image by analyzing the T2 relaxation time constant information;
    designating a propagation path of said high-energy radiation proceeding in the subject to said target volume; and
    selectively orienting said propagation path dependent on the identified degree of attenuation of the high-energy radiation in the propagation path.

2. A method as claimed in claim 1 comprising identifying said degree of attenuation in said propagation path by identifying objects in said propagation path represented by the obtained magnetic resonance image exhibiting a T2 relaxation time constant below a predetermined threshold value.

3. A method as claimed in claim 2 comprising identifying additional objects in said obtained magnetic resonance image exhibiting a T2 relaxation time constant above said predetermined threshold value, and then subsequently suppressing said additional objects in said obtained magnetic resonance image.

4. A method as claimed in claim 3 comprising suppressing said additional objects in said obtained magnetic resonance image by subtracting said additional objects from said obtained magnetic resonance image.

5. A method as claimed in claim 2 comprising employing a value in a time range between 1 ms and 5 ms as said predetermined threshold value.

6. A method as claimed in claim 2 comprising additionally identifying, using said T2 relaxation time constant information, signals in said obtained magnetic resonance image originating from a cladding of a local coil in the magnetic resonance apparatus used to generate the obtained magnetic resonance image and, from said signals, identifying said local coil in said obtained magnetic resonance image as a hiqh-enerqv radiation-attenuating object.

7. A method as claimed in claim 1 comprising generating said obtained magnetic resonance image by exciting nuclear spins in the subject by exposing the subject to a radio-frequency pulse, and after a predetermined time interval, beginning to acquire magnetic resonance data signals from the subject resulting from the excitation.

8. A method as claimed in claim 7 comprising acquiring said magnetic resonance data signals after a predetermined time interval that is less than 1 ms and greater than 1 μs.

9. A method as claimed in claim 7 wherein said predetermined time interval is a first predetermined time interval and comprising, after a second predetermined time interval following said RF pulse, which is longer than said first predetermined time interval, acquiring additional magnetic resonance data signals and subtracting the additional magnetic resonance data signals from the magnetic resonance data signals acquired after said first predetermined time interval and before said second predetermined time interval in order to identify objects exhibiting a T2 relaxation time constant below a threshold value.

10. A method as claimed in claim 9 comprising employing, as said first predetermined time interval, a time interval that is shorter than 1 ms and longer than 1 μs, and employing, as said second predetermined time interval, a time interval that is shorter than 5 ms and longer 1 ms.

11. A method as claimed in claim 7 comprising entering said magnetic resonance data into k space with a radial scanning technique.

12. A method as claimed in claim 1 comprising
generating said obtained magnetic resonance image using a local coil in said magnetic resonance apparatus in order to excite nuclear spins in the subject, said local coil causing aliasing in said obtained magnetic resonance image and comprising, by analyzing said aliasing in said obtained magnetic resonance image and using known information concerning a form of said local coil, identifying an exact form and position of the local coil in the magnetic resonance apparatus.

13. A method as claimed in claim 12 comprising removing said aliasing from said obtained magnetic resonance image by calculating signals in a volume of the subject from which the magnetic resonance image was obtained using said position and exact form of the local coil, and then subsequently suppressing said calculated signals from said obtained magnetic resonance image.

14. A method as claimed in claim 1 comprising obtaining a computed tomography image of a same volume of the subject from which said magnetic resonance image was obtained, and calibrating said magnetic resonance image using said computed tomography image.

15. A device compatible with MRI configured for automatically identifying a degree of high-energy attenuation in tissue of a living subject, comprising:
a computerized control unit;
an input interface connected to said control unit, said input interface being configured to enter a region-designating input into said control unit that designates a target region in a living subject containing tissue to be irradiated with high-energy radiation having an energy that therapeutically beneficially modifies said tissue, and that designates a propagation path in the subject to said target volume;
said control unit being configured to operate a magnetic resonance scanner to obtain a magnetic resonance image of the region of the subject designated by said region-designation input by exposing the region of the subject in the magnetic resonance apparatus to a magnetic resonance imaging sequence that causes the magnetic resonance image obtained to contain information that is representative of the T2 relaxation time constant of all objects contained in the propagation path in the subject; and
said control unit being configured to automatically identify a degree of attenuation of the high-energy radiation in the propagation path represented in said obtained magnetic resonance image by analyzing the T2 relaxation time constant information, and configured to make the identification of said degree of attenuation of high-energy in said propagation path available at an output of the control unit in a form allowing selective orientation of said propagation path dependent in said identification.

16. A device compatible with MRI configured as claimed in claim 15 wherein said control unit is configured to identify said degree of attenuation in an identified propagation path by identifying processor identifies said penetrating radiation-attenuating objects in said propagation path exhibiting a T2 relaxation time constant below a predetermined threshold value.

17. A device compatible with MRI configured as claimed in claim 16 wherein said control unit is configured to identify processor identifies additional objects in said obtained magnetic resonance image exhibiting a T2 relaxation time constant above said predetermined threshold value, and then subsequently suppresses said additional objects in said obtained magnetic resonance image.

18. A device compatible with MRI configured as claimed in claim 17 wherein said control unit is configured to identify processor identifies said additional objects in said obtained magnetic resonance image by subtracting said additional objects from said obtained magnetic resonance image.

19. A device compatible with MRI configured as claimed in claim 16 wherein said processor is configured to employ employs a value in a time range between 1 ms and 5 ms as said predetermined threshold value.

20. A device compatible with MRI configured as claimed in claim 16 wherein said control unit is configured to additionally identify using said T2 relaxation time constant information, signals in said magnetic resonance image originating from a cladding of a local coil in the magnetic resonance scanner used in order to generate the obtained magnetic resonance image and, from said signals, identifies said local coil in said magnetic resonance image as a high-energy radiation-attenuating object.

21. A device compatible with MRI configured as claimed in claim 15 wherein said control unit is configured to operate said magnetic resonance scanner to generate said obtained magnetic resonance image by exciting nuclear spins in the subject by exposing the subject to a radio-frequency pulse, and after a predetermined time interval, acquiring magnetic resonance data signals from the subject resulting from the excitation.

22. A device compatible with MRI configured as claimed in claim 21 wherein said control unit is configured to operate said magnetic resonance scanner in order to acquire said magnetic resonance data signals after a predetermined time interval that is less than 1 ms and greater than 1 μs.

23. A device compatible with MRI configured as claimed in claim 22 wherein said predetermined time interval is a first predetermined time interval and wherein said control unit is configured to operate said magnetic resonance scanner in order to acquire after a second predetermined time interval following said RF pulse, which is longer than said first predetermined time interval, additional magnetic resonance data signals and wherein said processor subtracts the additional magnetic resonance data signals from the magnetic resonance data signals acquired after said first predetermined time interval and before said second predetermined time interval in order to identify objects exhibiting a T2 relaxation time constant below a threshold value.

24. A device compatible with MRI configured as claimed in claim 23 wherein said control unit is configured to employ as said first predetermined time interval, a time interval that is shorter than 1 ms and longer than 1 μs, and is configured to employ, as said second predetermined time interval, a time interval that is shorter than 5 ms and longer 1 ms.

25. A device compatible with MRI configured as claimed in claim 21 wherein said control unit is configured to enter said magnetic resonance data into k space with a radial scanning technique.

26. A device compatible with MRI configured as claimed in claim 15 wherein said control unit is configured to operate said magnetic resonance scanner using a local coil in said magnetic resonance scanner in order to excite nuclear spins in the subject, said local coil causing aliasing in said obtained magnetic resonance image and wherein said control unit is configured to analyze said aliasing in said obtained magnetic resonance image using known information designating a coil type of said local coil and in order to identify an exact shape and position of the local coil in the magnetic resonance scanner.

27. A device compatible with MRI configured as claimed in claim 26 wherein said control unit is configured to remove said aliasing from said obtained magnetic resonance image by calculating signals in a volume of the subject from which the magnetic resonance image was obtained using said position and said exact form of the local coil, and then subsequently suppresses said calculated signals from said obtained magnetic resonance image.

28. A device compatible with MRI configured as claimed in claim 15 wherein said interface is configured to supply said control unit with a computed tomography image of a same volume of the subject from which said magnetic resonance image was obtained, and configured to calibrate said obtained magnetic resonance image using said computed tomography image.

29. A magnetic resonance apparatus, comprising:
a magnetic resonance scanner;
a computerized control unit;
an input interface connected to said control unit, said input interface being configured to enter a region-designating input into said control unit that designates a target region in a living subject containing tissue to be irradiated with high-energy radiation having an energy that therapeutically beneficially modifies said tissue, and that designates a propagation path in the subject to said target volume;
said control unit being configured to operate a magnetic resonance scanner in order to obtain a magnetic resonance image of the region of the subject designated by said region-designation input by exposing the region of the subject in the magnetic resonance apparatus to a magnetic resonance imaging sequence that causes the obtained magnetic resonance image to contain information that is representative of the T2 relaxation time constant of all objects contained in the propagation path in the subject; and
said control unit being configured to automatically identify a degree of attenuation of the high-energy radiation in the propagation path represented in said obtained magnetic resonance image by analyzing the T2 relaxation time constant information, and in order to make the identification of said degree of attenuation of high-energy in said propagation path available at an output of the control unit in a form allowing selective orientation of said propagation path dependent in said identification.

30. A non-transitory computer-readable storage medium encoded with programming instructions, said medium being loaded into a computerized control unit of a magnetic resonance imaging system comprising
a magnetic resonance scanner and
an input interface connected to said computerized control unit, said programming instructions causing said computerized control unit to:
receive, as an input,
designation of a target volume in a living subject containing tissue to be irradiated with high-energy radiation having an energy associated therewith that produces a therapeutically beneficial modification of said tissue, and
a designation of a propagation path of said high-energy radiation proceeding in the subject to said target volume;
prior to irradiation of said target volume with said high-energy radiation,
obtaining a magnetic resonance image by operating the magnetic resonance scanner, over a region of the subject containing said target volume and said propagation path by exposing the subject in the magnetic resonance scanner to a magnetic resonance imaging sequence that causes the obtained magnetic resonance image to contain information that is representative of the T2 relaxation time constant of all objects contained in the propagation path;
automatically identify a degree of attenuation of the high-energy radiation in the propagation path represented in said obtained magnetic resonance image by analyzing the T2 relaxation time constant information; and provide an output allowing selective orientation of said propagation path dependent on the identified degree of attenuation of the high-energy radiation in the propagation path.

* * * * *